United States Patent
Yu

(10) Patent No.: US 10,955,526 B2
(45) Date of Patent: Mar. 23, 2021

(54) DEVICE AND METHOD FOR PROCESSING AN INPUT SIGNAL AND RADAR DEVICE

(71) Applicant: Robert Bosch GmbH, Stuttgart (DE)

(72) Inventor: Yikun Yu, Reutlingen (DE)

(73) Assignee: Robert Bosch GmbH, Stuttgart (DE)

( * ) Notice: Subject to any disclaimer, the term of this patent is extended or adjusted under 35 U.S.C. 154(b) by 318 days.

(21) Appl. No.: 16/238,615

(22) Filed: Jan. 3, 2019

(65) Prior Publication Data

US 2019/0219672 A1 Jul. 18, 2019

(30) Foreign Application Priority Data

Jan. 18, 2018 (DE) .......................... 102018200763.2

(51) Int. Cl.

| G01S 7/35 | (2006.01) |
| G01S 7/34 | (2006.01) |
| H03G 3/08 | (2006.01) |
| H04B 7/155 | (2006.01) |
| H03G 3/12 | (2006.01) |

(52) U.S. Cl.
CPC ............... *G01S 7/354* (2013.01); *G01S 7/34* (2013.01); *G01S 7/352* (2013.01); *H03G 3/08* (2013.01); *H03G 3/12* (2013.01); *H04B 7/15578* (2013.01)

(58) Field of Classification Search
CPC .... H04B 7/15578; H04B 1/0475; H03G 3/08; H03G 3/12; G01S 7/352; G01S 7/34; G01S 13/931; G01S 13/34; G01S 13/343; G01S 13/32; G01S 7/354; H03F 1/3247; H03F 1/3229

USPC ..... 455/240.1, 306, 307, 317; 342/174, 175, 342/200; 330/149, 151
See application file for complete search history.

(56) References Cited

U.S. PATENT DOCUMENTS

| 6,625,436 B1 * | 9/2003 | Tolson ................... H03D 3/007 375/136 |
| 7,587,188 B2 * | 9/2009 | Someya ............... H03G 3/3068 330/129 |
| 2012/0329419 A1 * | 12/2012 | Seo .......................... H04B 1/10 455/307 |
| 2017/0207801 A1 * | 7/2017 | Ashry Othman .... H04B 1/0475 |

* cited by examiner

*Primary Examiner* — Erin F Heard
*Assistant Examiner* — Michael W Justice
(74) *Attorney, Agent, or Firm* — Norton Rose Fulbright US LLP; Gerard Messina

(57) ABSTRACT

A device for processing an input signal, including a local oscillator, designed to generate an oscillator signal; a subtracting unit, designed to subtract an amplified correction signal from the input signal in order to generate a corrected input signal; a downmixer, designed to mix the corrected input signal downward to an intermediate frequency using the oscillator signal in order to generate a difference signal; a first amplifier unit, designed to amplify the difference signal in order to generate and output an output signal; a correcting unit, designed to suppress a predefined frequency range of the output signal in order to generate a correction-difference signal; an upmixer, designed to mix the correction-difference signal upward using the oscillator signal in order to generate a correction signal; and a second amplifier unit, designed to amplify the correction signal in order to generate the amplified correction signal.

7 Claims, 2 Drawing Sheets

DEVICE AND METHOD FOR PROCESSING AN INPUT SIGNAL AND RADAR DEVICE

CROSS REFERENCE

The present application claims the benefit under 35 U.S.C. § 119 of German Patent Application No. DE 102018200763.2 filed on Jan. 18, 2018, which is expressly incorporated herein by reference in its entirety.

FIELD

The present invention relates to a device for processing an input signal, a radar device, and a method for processing an input signal.

BACKGROUND INFORMATION

Radar devices play a central role in generating data for driver assistance systems and driving safety systems. Radar signals are emitted and the reflections are detected to ascertain distances, relative velocities, and angle ranges of objects.

Frequency-modulated continuous wave radar systems (FMCW radar systems) operate using periodic frequency modulation, which enables a time-linear accuracy of the measurement. The frequency of the emitted radar signal predefined by a local oscillator is cyclically modulated. During a signal sequence or a burst, the frequency rises, usually linearly, from a lowest frequency up to a highest frequency. The absolute value of the frequency interval between the transmitted signal and the received signal is a measure of the runtime and may thus be used for the distance determination.

One challenge in the analysis of the radar signals is that interfering contributions may occur, which have to be filtered out. A method for correcting offsets, which may occur due to self-mixing of the frequencies of the local oscillator, is described in U.S. Pat. No. 6,516,187 B1. The correction takes place in this case at intermediate frequencies.

In addition to the signal reflected on an object, further interfering contributions may occur. If transmitting antennas and receiving antennas different from one another are used, a part of the radar signals emitted by the transmitting antennas may be transmitted on a direct path to the receiving antennas. Furthermore, the radar devices are usually situated behind a cover of the vehicle, for example, a bumper. A further part of the radiation emitted by the transmitting antennas may be reflected at the cover and arrives from there at the receiver antennas.

To separate solely the frequency contributions of the actual reflection on an object in the vehicle surroundings, the contributions of the direct transmission or the contributions of the reflections on the cover have to be filtered out.

SUMMARY

The present invention provides a device for processing an input signal, a radar device, and a method for processing an input signal.

According to a first aspect, the present invention thus relates to a device for processing an input signal, which includes a local oscillator which generates an oscillator signal. A subtracting unit subtracts an amplified correction signal from the input signal in order to generate a corrected input signal.

A downmixer mixes the corrected input signal downward to an intermediate frequency using the oscillator signal in order to generate a difference signal. A first amplifier unit amplifies the difference signal in order to generate an output signal and output it. A correcting unit suppresses a predefined frequency range of the output signal in order to generate a correction-difference signal. An upmixer mixes the correction-difference signal upward using the oscillator signal in order to generate a correction signal. A second amplifier unit amplifies the correction signal in order to generate the amplified correction signal.

According to a second aspect, the present invention thus relates to a radar device, which includes a transceiver unit, which outputs a radar signal and receives the reflected radar signal in order to generate an input signal. The radar device furthermore includes a device for processing the input signal generated by the transceiver unit.

According to a third aspect, the present invention thus relates to a method for processing an input signal. An oscillator signal is generated. An amplified correction signal is subtracted from the input signal in order to generate a corrected input signal. The corrected input signal is mixed downward to an intermediate frequency using the oscillator signal in order to generate a difference signal. The difference signal is amplified in order to generate an output signal. The output signal is output. A predefined frequency range of the output signal is suppressed in order to generate a correction-difference signal. The correction-difference signal is mixed upward using the oscillator signal in order to generate a correction signal. The correction signal is amplified in order to generate the amplified correction signal.

Preferred specific embodiments of the present invention are described herein.

The present invention is generally suitable for correcting or eliminating certain frequency ranges. In particular, the present invention may be used for correcting radar signals which are generated using an FMCW method. Since the frequency rises essentially linearly in the FMCW method, the frequency differences during the runtime have a smaller absolute value for the interfering contributions than for the actual reflections on the object, since they have a shorter runtime. By eliminating this lower frequency range, the interfering components may thus be removed.

The correction, i.e., the subtraction of the correction signal from the input signal, does not take place in the intermediate frequency range but rather already at the radio frequency, RF, i.e., before the input signal is mixed downward. A better correction of the interfering signals is thus achieved. While in the case of a correction in the intermediate frequency range, strong interferences are additionally amplified by the downmixer, which results in additional noise, such effects may be avoided by a correction of the input signal itself. The quality of the output signal is thus substantially enhanced. In particular, the signal yield, the linearity, and the sensitivity are enhanced.

According to one preferred refinement of the device, the correcting unit includes a low-pass filter. The low-pass filter may suppress the signal contributions, so that only the above-mentioned interfering contributions having low frequencies remain. These are subtracted from the input signal with the aid of the subtracting unit after the amplification.

According to one preferred refinement of the device, the low-pass filter suppresses a frequency range having frequencies above 100 kHz. According to other specific embodiments, the low-pass filter may suppress frequencies greater than 1 MHz, greater than 50 kHz, or greater than 10 kHz. The signal contributions may be 10 MHz above the oscillator frequency in a radar device, for example, while the contributions of the interfering signals reflected on the cover may be in the range of approximately 10 kHz, and the contributions of the direct transmission from the transmitter to the receiver may be in the range of approximately 1 kHz. The interfering contributions may thus be separated from the actual signal contributions with the aid of the low-pass filter.

According to one preferred refinement of the device, the low-pass filter includes an analog amplifier having a first capacitor connected in parallel and a first resistor connected in series.

According to one preferred refinement of the device, a second resistor and a second capacitor are connected in parallel to the first amplifier unit. The second resistor acts as a shunt resistor. An additional low-pass filter is thus provided, which filters out noise and interferences which are outside the intermediate frequency range. The quality of the output signal is thus further enhanced.

According to one preferred refinement of the device, the downmixer and/or the upmixer are designed as passive switches, which are actuated using the oscillator signal.

According to one preferred refinement of the radar device, the transceiver unit is designed to use the oscillator signal of the local oscillator to generate the radar signal. The oscillator signal may preferably be an FMCW oscillator signal of an FMCW method. In particular, the frequency of the oscillator signal may rise linearly with respect to time during cyclic bursts.

According to one preferred refinement of the method, the suppression of the predefined frequency range of the output signal is carried out with the aid of a low-pass filter.

BRIEF DESCRIPTION OF THE DRAWINGS

In all figures, identical or functionally-identical elements and devices are provided with the same reference numerals.

DETAILED DESCRIPTION OF EXAMPLE EMBODIMENTS

Figure 1:
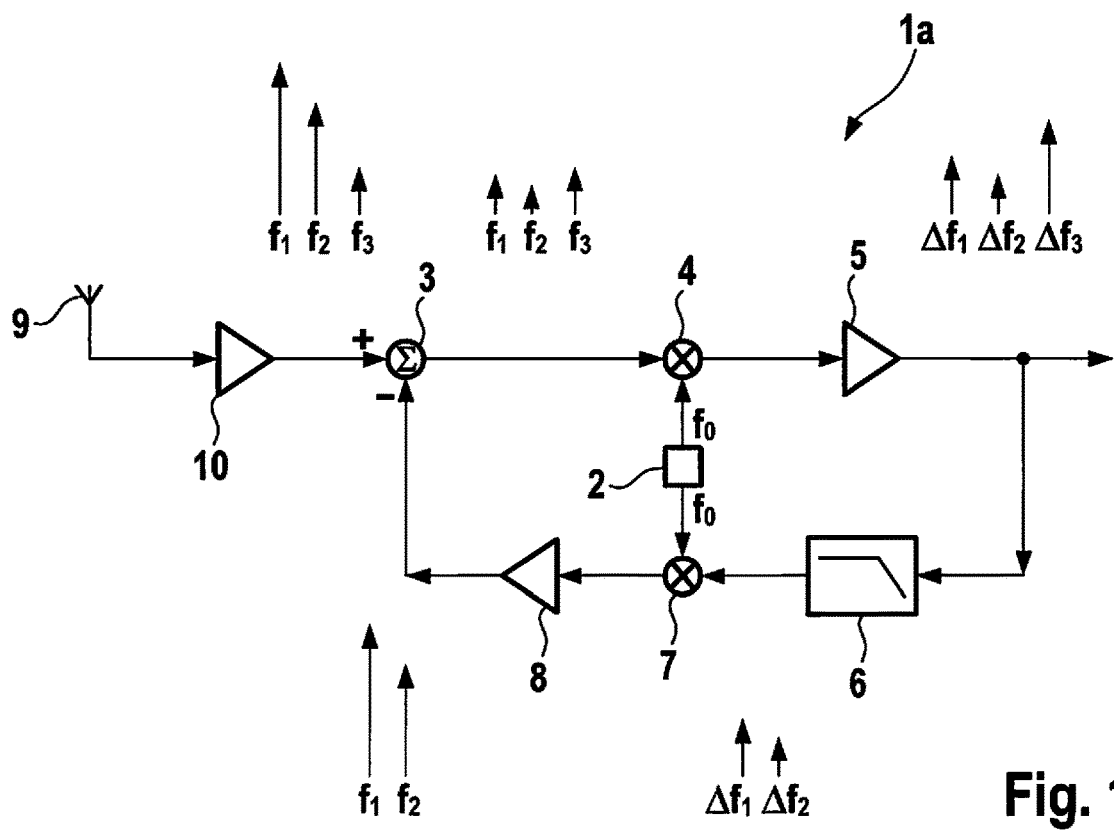
FIG. 1 shows a schematic circuit diagram of a device for processing an input signal according to one specific embodiment of the present invention.

A schematic circuit diagram of a device 1a for processing an input signal is illustrated in FIG. 1.

Device 1a is coupled to a receiver unit 9 and receives an input signal therefrom. Device 1a may be in particular part of a radar device, receiver unit 9 receiving reflected radar waves. Receiver unit 9 may be designed at the same time as a transmitting unit, which emits radar waves. Alternatively, a separate transmitting unit may be provided, which emits the radar waves. Receiver unit 9 and optionally the transmitting unit each include at least one radar antenna.

Device 1a furthermore includes a low noise amplifier (LNA) 10, which is distinguished by low noise, to also be able to amplify weak signals well, without converting the frequency band into lower frequencies.

The input signal amplified by low noise amplifier 10 is further processed by a subtracting unit 3, which subtracts an amplified correction signal from the input signal and thus generates a corrected input signal. The correction signal is computed in a feedback loop, which is described in greater detail hereafter.

The corrected input signal is further processed by a downmixer 4. Downmixer 4 is connected to a local oscillator 2, local oscillator 2 generating an oscillator signal having a predefined time-dependent frequency f0, i.e., having a predefined frequency curve. The oscillator signal is preferably an FMCW oscillator signal having a periodically linearly rising frequency curve. The oscillator signal is used to determine the frequency of the emitted radar signals.

Downmixer 4 is designed as a multiplicative mixer, which converts the corrected input signal, which represents the high-frequency signal, by mixing with the oscillator signal into a difference signal, which corresponds to an intermediate-frequency signal. Since the frequency of the emitted radar signal is determined by frequency f0 of the oscillator signal, the difference signal corresponds to the frequency differences between the emitted and the reflected radar signal, which are essentially established by the runtimes of the individual contributions of the reflected radar signal.

The reflected radar signal contains first frequency contributions f1, which arise due to direct transmission of the radar waves from the transmitting unit to receiver unit 9. Furthermore, the reflected radar signal contains second frequency contributions f2, which occur in the case of reflections of the radar waves on a cover of the vehicle. Finally, the reflected radar signal contains third frequency contributions f3 due to the reflection on an object in the vehicle surroundings.

The difference signal is amplified with the aid of a first amplifier unit 5 to generate an output signal. The output signal corresponds to amplified differences $\Delta f1$, $\Delta f2$, $\Delta f3$ between first through third frequency contributions f1, f2, f3 and frequency f0 of the oscillator signal. The output signal is output and may be analyzed by analysis units connected to device 1a. The analysis units may also be elements of device 1a. In particular, driver assistance systems or driving safety systems may control vehicle functions of the vehicle or transmit pieces of information to a driver of the vehicle on the basis of the output signals.

The output signal is furthermore transmitted to a correcting unit 6, which suppresses a frequency range of the output signal. Correcting unit 6 may be designed, for example, as a low-pass filter, which suppresses all frequencies above 10 kHz. Therefore, only interfering contributions $\Delta f1$, $\Delta f2$ remain, which are output as a correction-difference signal.

The correction-difference signal is mixed upward by an upmixer 7 using the oscillator signal, a correction signal being generated. Upmixer 7 is designed as a multiplicative mixer, the correction-difference signal representing the intermediate-frequency signal, and the correction signal representing the corresponding high-frequency signal.

The correction signal is amplified with the aid of a second amplifier unit 8, which generates and outputs an amplified correction signal. The amplified correction signal is used as described above by subtracting unit 3 for correcting the input signal. Subtracting unit 3 thus already corrects the input signal in the high-frequency range.

Figure 2:
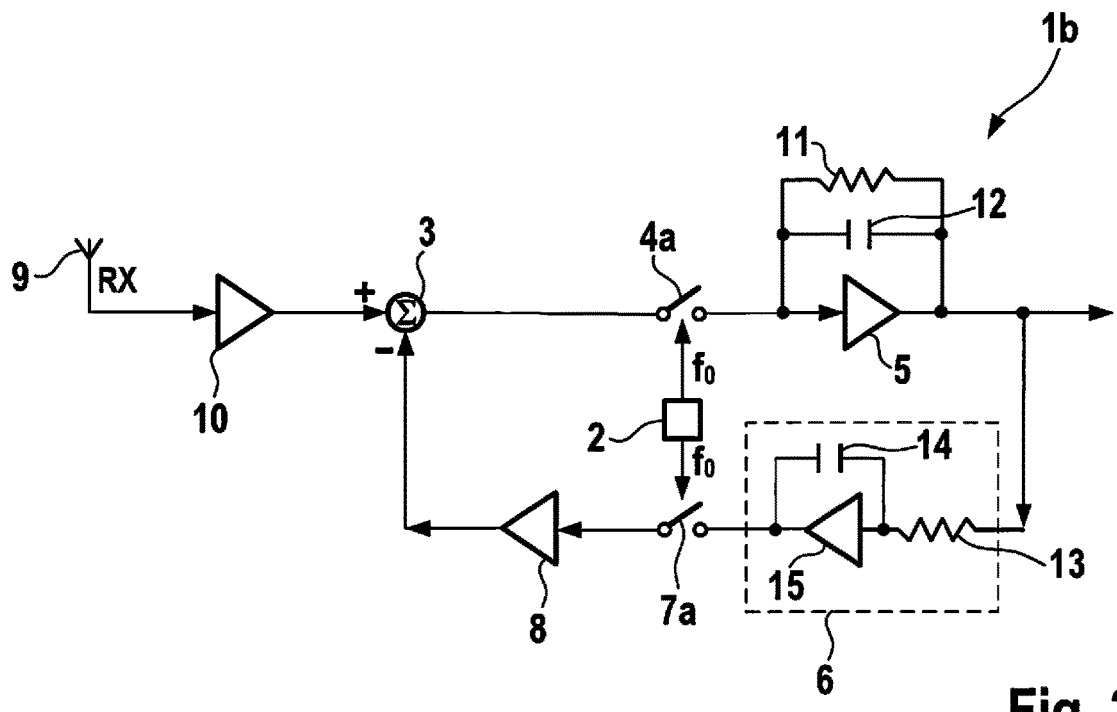
FIG. 2 shows a schematic block diagram of a device for processing an input signal according to another specific embodiment of the present invention.

A schematic circuit diagram of a further device 1b for processing an input signal is illustrated in FIG. 2. Device 1b essentially corresponds to device 1a illustrated in FIG. 1, so that only the differences will be described in greater detail hereafter. Thus, the downmixer and the upmixer are designed as corresponding first passive switch 4*a* and second passive switch 7*a*.

Furthermore, correcting unit 6 is designed as a low-pass filter, which includes an analog amplifier 15 having a first capacitor 14 connected in parallel and a first resistor 13 connected in series.

Finally, a second resistor 11 and a second capacitor 12, which represent a low-pass filter for suppressing noise and interferences outside the intermediate frequency range, are connected in parallel to first amplifier unit 5.

Figure 3:
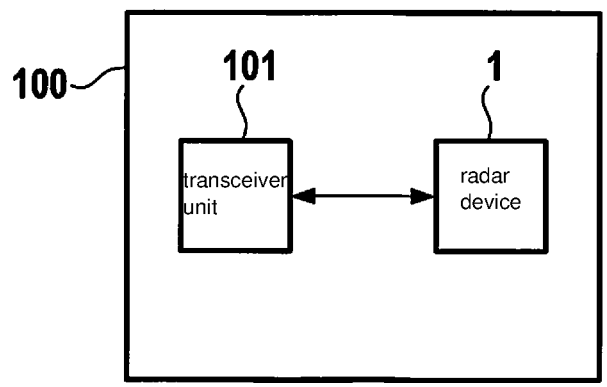
FIG. 3 shows a schematic block diagram of a radar device according to one specific embodiment of the present invention.

A schematic block diagram of a radar device 100 according to one specific embodiment of the present invention is illustrated in FIG. 3. Radar device 1 includes a transceiver unit 101, which emits a radar signal and receives the reflected radar signal. Transceiver unit 101 may include a plurality of radar antennas. The frequency of the emitted radar signal is preferably time-dependent and may be modulated using an FMCW method.

Radar device 100 is coupled to a device 1 for processing the input signal generated by transceiver unit 101. Device 1 may be one of above-described devices 1*a*, 1*b*. Local oscillator 2 of device 1 determines the frequency of the emitted radar signals at the same time.

Figure 4:
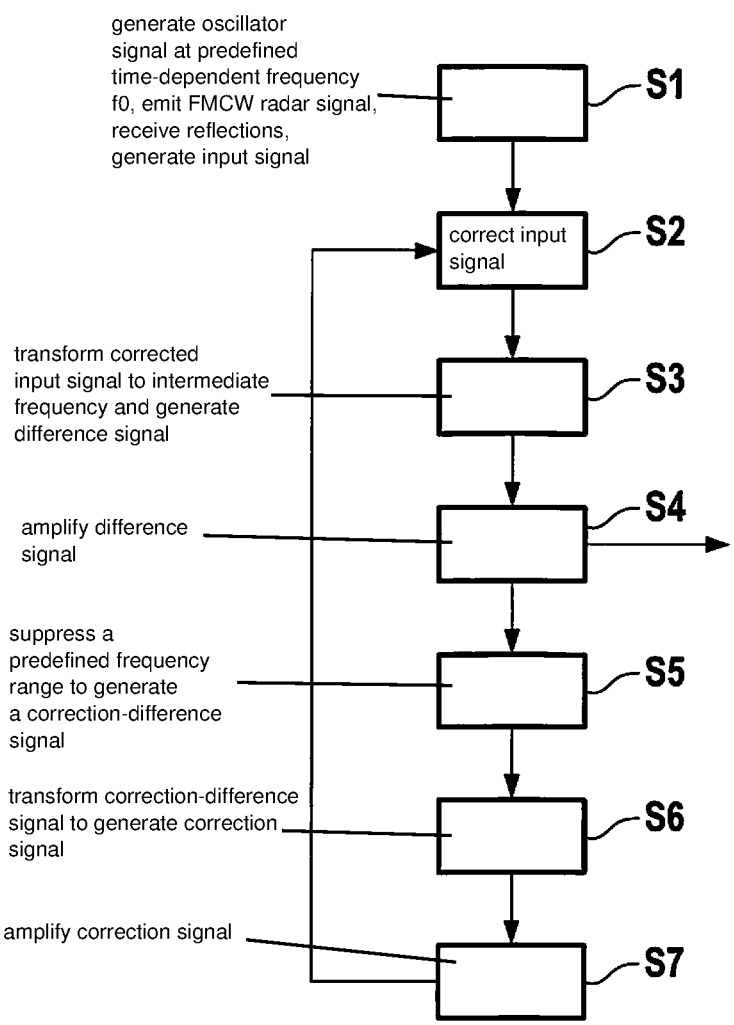
FIG. 4 shows a flow chart of a method for processing an input signal according to one specific embodiment of the present invention.

FIG. 4 shows a flow chart of a method for processing an input signal. The method may be carried out in particular using an above-described device 1, 1*a*, 1*b*.

In a first method step S1, an oscillator signal is generated at a predefined time-dependent frequency f0. An FMCW radar signal having frequency f0 is emitted, the reflections are received, and a corresponding input signal is generated.

In a method step S2, the input signal is corrected by subtracting an amplified correction signal from the input signal and thus generating a corrected input signal.

In a method step S3, the corrected input signal is transformed to an intermediate frequency with the aid of a downmixer 4 using the oscillator signal, a difference signal being generated.

The difference signal is amplified in a step S4 to generate an output signal. The output signal is output and may be analyzed further, for example, to ascertain objects and properties of the objects in vehicle surroundings.

In a step S5, a predefined frequency range of the output signal is suppressed in order to generate a correction-difference signal. For example, a frequency range having frequencies above a predefined threshold value, for example, 10 kHz, may be suppressed with the aid of a low-pass filter.

In a step S6, the correction-difference signal is transformed using the oscillator signal with the aid of an upmixer, a correction signal being generated.

The correction signal is finally amplified in a step S7 in order to generate the amplified correction signal. The amplified correction signal is used in a negative feedback loop in step S2 to generate the corrected input signal.

The amplified correction signal essentially contains only interfering components f1, f2, which are subtracted from the input signal, so that essentially only actual signal components f3 remain. The still remaining interfering components are already strongly suppressed at the input of downmixer 4, so that remaining interferences have a substantially lower influence on the sensitivity and linearity of the output signal.

What is claimed is:

1. A device for processing an input signal, comprising:
   a local oscillator configured to generate an oscillator signal;
   a subtracting unit configured to subtract an amplified correction signal from the input signal in order to generate a corrected input signal;
   a down mixer configured to mix the corrected input signal downward to an intermediate frequency using the oscillator signal in order to generate a difference signal;
   a first amplifier unit configured to amplify the difference signal in order to generate and output an output signal;
   a correcting unit configured to suppress a predefined frequency range of the output signal in order to generate a correction-difference signal;
   an up mixer configured to mix the correction-difference signal upward using the oscillator signal in order to generate a correction signal; and
   a second amplifier unit configured to amplify the correction signal to generate the amplified correction signal;
   wherein the correcting unit encompasses a low-pass filter.

2. The device as recited in claim 1, wherein the low-pass filter suppresses a frequency range of frequencies of greater than 100 kHz.

3. The device as recited in claim 1, wherein the low-pass filter encompasses an analog amplifier including a first capacitor connected in parallel and a first resistor connected in series.

4. The device as recited in claim 1, further comprising:
   a second resistor and a second capacitor, which are connected in parallel to the first amplifier unit.

5. A radar device, comprising:
   a transceiver unit configured to emit a radar signal and receive the reflected radar signal in order to generate an input signal; and
   a device for processing the input signal generated by the transceiver unit, the device including:
     a local oscillator configured to generate an oscillator signal;
     a subtracting unit configured to subtract an amplified correction signal from the input signal in order to generate a corrected input signal;
     a down mixer configured to mix the corrected input signal downward to an intermediate frequency using the oscillator signal in order to generate a difference signal;
     a first amplifier unit configured to amplify the difference signal in order to generate and output an output signal;
     a correcting unit configured to suppress a predefined frequency range of the output signal in order to generate a correction-difference signal;
     an up mixer configured to mix the correction-difference signal upward using the oscillator signal in order to generate a correction signal; and
     a second amplifier unit configured to amplify the correction signal to generate the amplified correction signal;
     wherein the correcting unit encompasses a low-pass filter.

6. The radar device as recited in claim 5, wherein the transceiver unit is configured to use the oscillator signal of the local oscillator to generate the radar signal.

7. A method for processing an input signal, comprising:
   generating an oscillator signal;
   subtracting an amplified correction signal from the input signal in order to generate a corrected input signal;
   mixing the corrected input signal downward to an intermediate frequency using the oscillator signal in order to generate a difference signal;

amplifying the difference signal in order to generate and output an output signal;
suppressing a predefined frequency range of the output signal in order to generate a correction-difference signal;
mixing the correction difference signal upward using the oscillator signal in order to generate a correction signal; and
amplifying the correction signal in order to generate the amplified correction signal;
wherein the suppression of the predefined frequency range of the output signal is carried out with the aid of a low-pass filter.

\* \* \* \* \*